Dec. 13, 1960 G. ABRAHAM 2,964,654

ELECTRICAL SWITCHING CIRCUIT

Filed March 29, 1957 3 Sheets-Sheet 1

INVENTOR
GEORGE ABRAHAM

BY W R Maltby
Richard C Reed ATTORNEYS

INVENTOR
GEORGE ABRAHAM

BY W R Maltby
Richard C Reed
ATTORNEYS

Dec. 13, 1960 G. ABRAHAM 2,964,654

ELECTRICAL SWITCHING CIRCUIT

Filed March 29, 1957 3 Sheets-Sheet 3

INVENTOR
GEORGE ABRAHAM

BY W R Matthews
Richard C Reed
ATTORNEYS

United States Patent Office 2,964,654

Patented Dec. 13, 1960

2,964,654

ELECTRICAL SWITCHING CIRCUIT

George Abraham, 3107 Westover Drive, SE., Washington, D.C.

Filed Mar. 29, 1957, Ser. No. 649,572

7 Claims. (Cl. 307—88.5)

(Granted under Title 35, U.S. Code (1952), sec. 266)

The invention described herein may be manufactured and used by or for the Government of the United States of America for governmental purposes without the payment of any royalties thereon or therefor.

The present invention relates in general to electrical signaling translating circuits and in particular to multistable circuits.

In the field of electronics, a bistable circuit may find many useful applications. By way of example, in a counter, a plurality of bistable circuits, connected in tandem, may be used when it is desired to count pulses occurring at either regular intervals or at random. At present, counters employ conventional bistable circuits that have a number of disadvantages. For example, to obtain only two stable states, these circuits usually require a complicated arrangement using two transistors or two electron tubes. Thus, if several bistable circuits are utilized in a single counter, the physical size and weight of the counter will be appreciable. If electron tubes are used, the power consumption will be high and a large portion of the power supplied to the counter, because of low efficiency, will be dissipated as heat.

In accordance with the foregoing, it is an object of of the present invention to provide a bistable circuit in which a comparatively large output signal is obtained from a small signal input.

Another object of the present invention is to provide a bistable electrical circuit in which the power handling capabilities of an appropriate variable impedance device is substantially increased.

Another object of the present invention is to provide a bistable electrical circuit in which the efficiency of the variable impedance device utilized is substantially increased.

Another object of the present invention is to provide a bistable electrical circuit in which optimum utilization of the voltage controlled negative resistance of a selected variable impedance device is obtained.

Another object of the present invention is to provide a circuit in which a junction transistor whose normal current multiplication factor is less than unity may have, due to minority carrier storage, an effective current multiplication greater than unity.

Another object of the present invention is to provide a transistor switching circuit whose range of stable states may vary from substantially zero voltage to the breakdown voltage.

Another object of the present invention is to provide a circuit in which a source of dynamic B+ is employed for push-pull injection of minority carriers into a variable impedance device to cause the storage of a steady state of electrical charge carriers in the variable impedance device to obtain a voltage controlled negative resistance curve on which two stable states may be located.

Another object of the present invention is to provide a circuit with a variable impedance device having positive internal feedback so that the circuit may be operated as an astable, monostable, or bistable device.

Other objects and many of the attendant advantages of this invention will be readily apparent as the same becomes better understood by reference to the foregoing detailed description when considered in connection with the accompanying drawings wherein:

Fig. 1 discloses a first embodiment of the present invention;

Fig. 2 discloses a second embodiment of the present invention;

Figure 1:
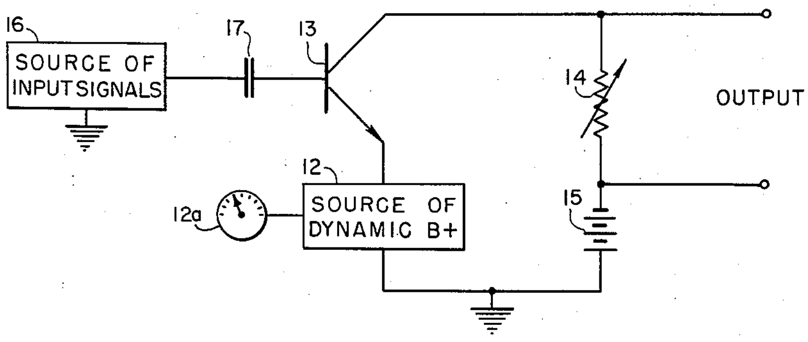
Figure 2:
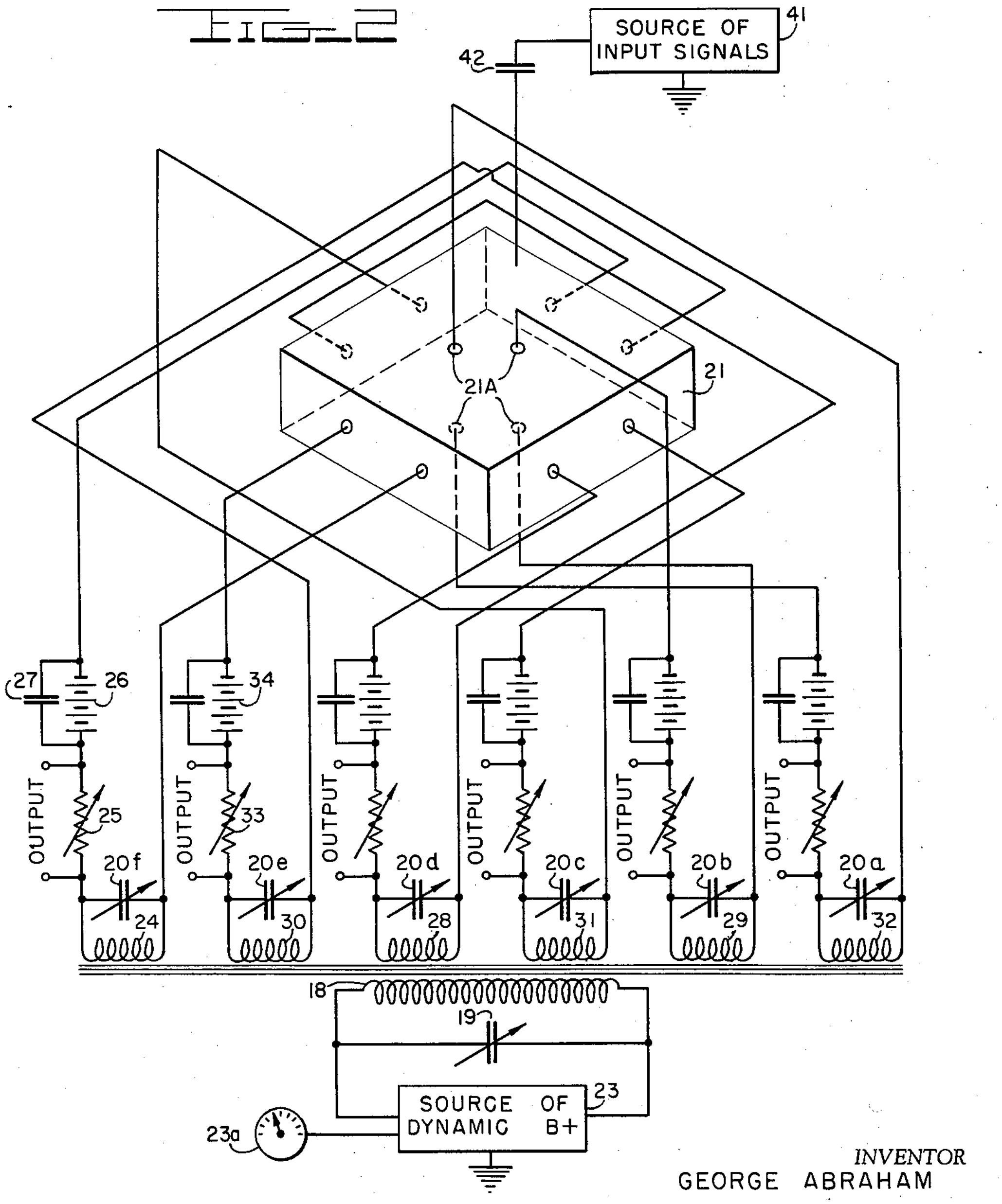
Figure 6:
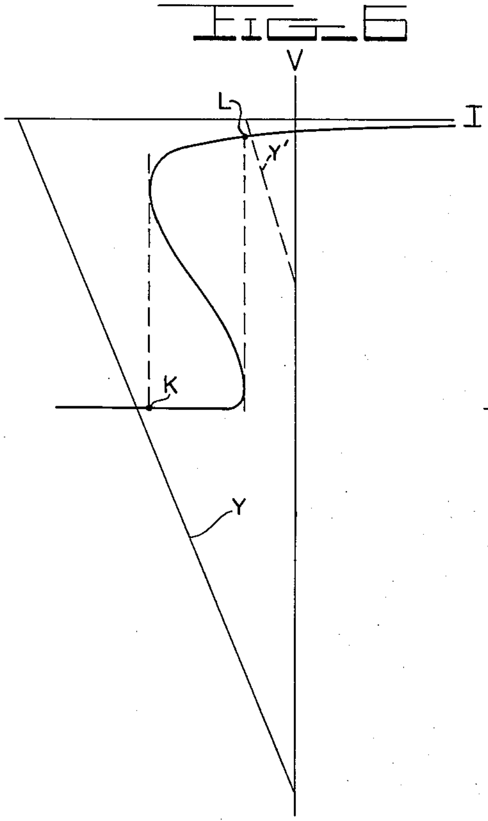
Figure 7:
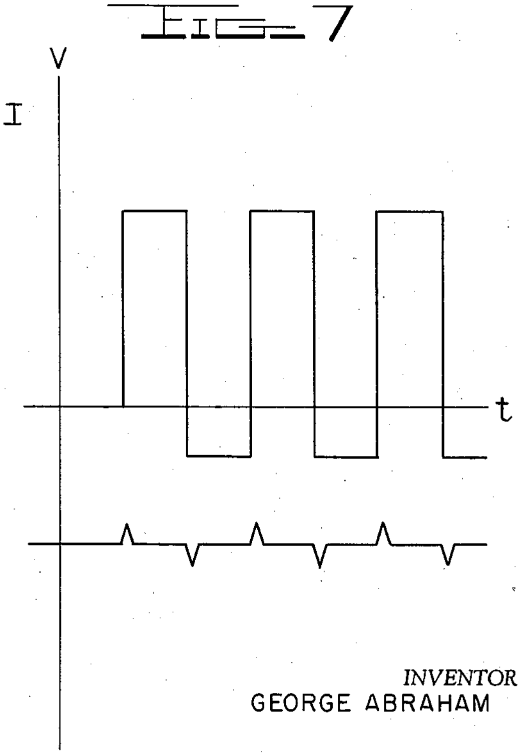

Fig. 6 represents the load line drawn on the negative resistance curve of the variable impedance device shown in the circuit of Fig. 1 or 2 when the circuit is operated as a monostable device; and Fig. 7 represents the voltage-time characteristic across the output of the circuit shown in Fig. 1 or across each output shown in Fig. 2 when the circuit is operated as a bistable device and in addition the figure shows a voltage-time characteristic of the triggering pulses required to trigger the circuit from one stable state to another.

As used in the present application, "dynamic B+" is defined as a continually varying potential applied to a selected nonlinear device to store energy therein and to enable the device to function as an amplifier and/or to exhibit a negative resistance characteristic. As an example, a source of dynamic B+ may be a source of recurring signals providing signals having a frequency or repetition rate greater than the reciprocal of the lifetime of electrical charge carriers injected into the variable impedance device to which the source of dynamic B+ is connected.

In the present invention, as indicated below, a constant voltage, square wave generator is used as a source of dynamic B+. It is understood, however, that the source of dynamic B+ may be any source of recurring signals so long as the frequency or repetition rate of the recurring signals is greater than the reciprocal of the lifetime of injected electrical charge carriers and so long as each element of variable impedance device 13 connected to source of dynamic B+, as shown in Fig. 1, is driven positive during one portion of the cycle of operation and negative during another portion of the cycle with respect another element of the negative impedance device during each cycle of operation.

Before proceeding with a detailed description of the present invention, it is noted that "push-pull injection" occurs when a source of dynamic B+ is applied across a pair of junctions connected back to back in a semiconductor device so that electrical charge carriers are injected into the regions bounding each junction during the portion of the cycle of operation in which the junction is forward biased.

Thus, a semiconductor device, having a pair of junctions, is connected in "push-pull injection relationship" with a source of dynamic B+ when the source of dynamic B+ is applied across the junctions for push-pull injection of electrical charge carriers into the device.

The pair of junctions may be included in a single semiconductor device or the junctions may be in separate devices which are externally connected in a circuit.

In accordance with the present invention, a bistable circuit is provided wherein a source of dynamic B+ is connected for push-pull injection of electrical charge carriers into a variable impedance device at a rate greater than the rate at which the electrical charge carriers decay due to recombination to maintain a steady state of stored electrical charge carriers in the variable impedance device. The stored electrical charge carriers are used to obtain a voltage controlled negative resistance curve having two regions in which stable states of operation may be located. An appropriate circuit employing a variable impedance device having stored electrical charge carriers may also be operated as a monostable or astable device. Since the dynamic B+ and variable impedance device are in push-pull injection relationship, a circuit is obtained in which the variable impedance device and the dynamic B+ are operated with greater efficiency to provide an improved negative resistance curve. The circuit thus obtained may be triggered to a desired state in one of several ways such as by optical triggering or by varying the relative amplitude, phase, or width of pulses applied to a selected element of the variable impedance device or by varying the bias, or by varying the impedance load on the variable impedance device, or by varying the frequency, amplitude or phase of the dynamic B+ applied to the variable impedance device. For example, triggering from a first stable state to a second stable state may be accomplished by applying a pulse of proper polarity and proper amplitudes for a given load line to a desired element of the variable impedance device and a pulse of reverse polarity and the same amplitude may be applied to trigger the multistable circuit from the second to the first stable state.

Referring to Fig. 1, the first embodiment of the present invention comprises a bistable circuit in which a source of dynamic B+ 12 is connected in series with variable impedance device 13, variable resistor 14 and a source of direct current voltage 15. Thus, the source of dynamic B+ is connected to the variable impedance device for push-pull injection of minority carriers i.e., the dynamic B+ and variable impedance device are connected in push-pull injection relationship. Control knob **12*a*, which is connected to source of dynamic B+ 12, may be used to vary such parameters of the source of dynamic B+ as frequency, phase, duration and magnitude. A source of input signals 16 is connected through capacitor 17 to one element of the variable impedance device 13 and the output of the multistable circuit is taken across variable resistor 14**.

Referring to Fig. 2, the bistable circuit shown is provided with a variable impedance device 21 having a base of one type of semiconductor material, for example P-type material. Each side of the base of the variable impedance device 21 has connected thereto a plurality of areas **21*a* of another type of semiconductor material, such as N-type material. The primary of transformer 18 may be tuned to a selected frequency by variable capacitor 19 and the secondaries of the transformer may be tuned to the selected frequency by variable capacitors 20*a* to 20*f*. The primary of transformer 18 is connected in series with a source of dynamic B+ 23 and each secondary of the transformer is connected in series with a variable resistor, a source of direct current voltage and selected areas connected to two opposite sides of the variable impedance device 21. For example secondary 24 is connected in series with variable resistor 25, the source of direct current voltage 26 and two selected areas on opposite sides of the base material of variable impedance device 21. A capacitor 27 is connected across the source of direct current voltage 26. In a similar manner, the secondaries 28 to 32 are connected in series with a variable resistor, a source of direct current voltage and through two selected areas on opposite sides of the variable impedance device 21. Thus, the source of dynamic B+ 23 is connected to selected areas on opposite sides of the variable impedance device for push-pull injection of minority carriers i.e., the selected areas and the source of dynamic B+ are connected in push-pull injection relationship. With the arrangement shown, it is possible to dynamically control the resistivity of the variable impedance device. For example, if the base material of the variable impedance device has a resistivity of 50 ohm-cm., by the injection of the proper magnitude of minority carriers, it is possible to lower the resistivity to 5 ohm-cm. Control knob 23*a*, which is connected to source of dynamic B+ 23, may be used to vary such parameters of the source of dynamic B+ as frequency, phase, duration and magnitude. A source of input signals 41 is connected to the base material through capacitor 42**. It is understood that the connections to the base material may be made as in any appropriate semiconductor junction unit or as in any point contact unit and that as many connections to each side of the base material may be made as is desired for a particular application.

In the embodiment shown in Figs. 1 and 2 the variable impedance devices 13 and 21 may be any suitable elements wherein two or more electrical charge carriers having appropriate lifetimes are operative, for example, arc discharge devices or semiconductor devices such as diodes, transistor triodes, transistor tetrodes, or phototransistors, and the electrical charge carriers may be any positive or negative charges such as electrons or holes.

In the embodiments shown in Figs. 1 and 2, the circuit is operated from a constant voltage square wave generator used as a source of dynamic B+, for example at 1 mc. with a 50% duty cycle. In Fig. 1 the variable impedance device used may be either a point contact transistor or a junction transistor of the N-P-N type. In Fig. 2 the variable impedance device may have a base of P-type material and the material connected to the base at selected points may be of the N-type material. As to the dimensions of the base (an appropriate slab of material) of the variable impedance device in either Fig. 1 or 2, the width and length are not critical and the thickness should be equal to or less than the diffusion length. If a transistor is used as a variable impedance device, the collector-base junction, which normally has a higher breakdown voltage than the emitter-base junction, is reversed biased. This in turn forward biases the emitter base junction. The connections to the base in Fig. 2 may be the same as used in a junction type transistor or in a point contact transistor. Due to the type of materials used, the injected electrical charge carriers in Figs. 1 and 2 are holes. For a given value of dynamic B+ the values of reversed bias and load impedance are selected to give a desired value of stored holes and a resulting negative resistance. It is understood that other types of dynamic B+ could be used in combination with a selected variable impedance device having an appropriate base material to maintain a steady state of electrical charge carriers. For example, a high frequency, sine wave oscillator could be used to inject and store electrons in a base of N-type material.

In the operation of the bistable circuit shown in Fig. 1, the source of dynamic B+ 12 is connected to the variable impedance device 13 for push-pull injection of minority carriers; and after a few cycles of operation, the number of holes stored in the variable impedance device reaches a steady state. Signals are then applied to the base of the variable impedance device through capacitor 17 from the source of input signals 16 to trigger the bistable circuit to one of two stable states. The operation of the arrangement shown in Fig. 2 is similar to that shown in Fig. 1 except that the source of dynamic B+ is applied to the base material for push-pull injection of minority carriers across the opposite selected areas of the base material.

In order to understand the operation of the circuits shown in Figs. 1 and 2, it is necessary to appreciate the relationship between several factors that affect the number of holes stored in the steady state. When the variable impedance device used is a transistor these factors may be listed as follows: the transistor impedance, the load impedance, the bias, and the parameters of the dynamic B+ such as frequency, magnitude, phase and duration.

As indicated immediately above, the number of holes that will be stored in an N-type base material of a transistor will be determined in part by the internal impedance of the transistor i.e., by the barrier capacitance, barrier resistance, base capacitance and base resistance of the transistor. As will be explained presently, the transistor impedance is not static but varies with or is modulated by the dynamic B+ applied to the transistor. The transistor impedances are dependent in part on such factors as the lifetime of the electrical charge carriers and diffusion length in the base material of the transistor. These factors in turn are determined by the material used and the process of manufacturing the transistor. The internal impedances also depend in part on the conditions under which the transistor is operated in a particular circuit. This will become apparent during the analysis of Figs. 3A, 3B and 3C, which, it will be recalled, represent the equivalent circuit of a transistor before, during and immediately after the application of dynamic B+.

Figure 3A:
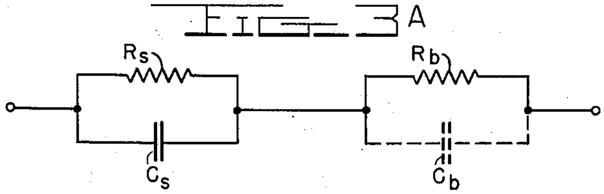
Fig. 3A represents the equivalent circuit of a transistor before dynamic B+ is applied.

Referring to Fig. 3A, when no dynamic B+ is applied to a transistor, if the transistor is a point contact unit having N-type, 5 ohm-cm. base material, the value of the barrier capacitance $C_s$ will be, depending on the design of the device, of the order of 1 to 3 $\mu\mu$f., the value of the barrier resistance $R_s$ will be approximately 5,000 ohms, the base capacitance $C_b$ will be less than 0.2 $\mu\mu$f., which normally may be neglected, and the base resistance $R_b$ will be approximately 100 ohms. The value of each impedance will be determined in part by the material used and the process of manufacture of the transistor.

Figure 3B:
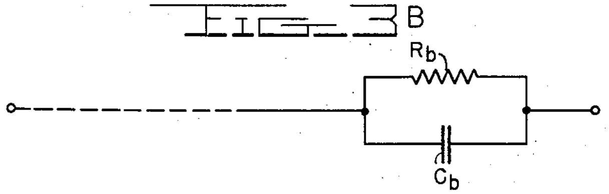
Fig. 3B represents the equivalent circuit of a transistor during the application of dynamic B+.

In the preferred embodiment of the present invention, a large magnitude of square wave dynamic B+ is applied to the transistor. As the dynamic B+ increases to its positive maximum value, there is considerable diffusion of electrical charge carriers into the base, and the value of the base capacitance $C_b$ becomes relatively large, for example, of the order of 350 $\mu\mu$f. (The last named value will depend on the parameters of the dynamic B+ applied.) The base resistance $R_b$ becomes smaller, approximately 60 ohms. As shown in Fig. 3B, these values cannot be neglected. The barrier capacitance $C_s$, because of the increased storage of electrical charge carriers, becomes larger, approximately 200 $\mu\mu$f. but the barrier resistance $R_s$ approaches zero, shunting out the increased barrier capacitance $C_s$. The barrier capacitance $C_s$ and the barrier resistance $R_s$ may, therefore, be neglected as shown in Fig. 3B.

Figure 3C:
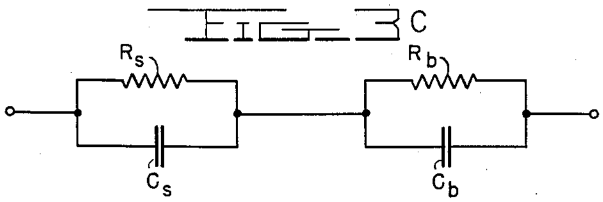
Fig. 3C represents the equivalent circuit of a transistor immediately after the dynamic B+ has been removed from the transistor.

As shown in Fig. 3C, when the dynamic B+ goes to zero, the barrier capacitance $C_s$ rapidly returns from the larger value of 200 $\mu\mu$f. to the smaller value of, say, 3 $\mu\mu$f. and the barrier resistance $R_s$ rapidly returns from approximately zero to 100 ohms. Due to the storage of minority carriers, the base resistance $R_b$, however, returns slowly from the smaller value of 60 ohms to the larger value of 100 ohms and the base capacitance $C_b$ returns slowly from the larger value of 350 $\mu\mu$f. to the smaller value of 0.2 $\mu\mu$f. Before the base capacitance $C_b$ can attain its smaller value another cycle of dynamic B+ is applied to the transistor to return the base capacitance $C_b$ to its larger value. If a series of cycles are applied by the dynamic B+ to the transistor at a frequency greater than the reciprocal of the lifetime of the injected electrical charge carriers, depending upon operating conditions in general and the type of material used and the frequency of the dynamic B+ in particular, after a few cycles of operation, the barrier capacitance $C_s$ will attain an average value. The number of electrical charge carriers stored in the barrier capacitance $C_s$ will, likewise, attain an average value or steady state that will be dependent in part upon the magnitude, duration and frequency of the dynamic B+ applied to the transistor as well as the design of the transistor.

Since the static barrier capacitance and static barrier resistance characteristics of a transistor are nonlinear, the quiescent value of the barrier capacitance and resistance are dependent upon the bias applied to the transistor. The dynamic barrier capacitance and resistance characteristics of the transistor are likewise nonlinear and deviate in shape from the curves for the respective static characteristics. The shape of the dynamic curves will also be dependent upon the dynamic operating conditions such as the number of holes stored in the steady state, the load and bias applied to the transistor as well as the characteristic of the transistor itself. For example, the steepness of the dynamic barrier capacitance curve will be increased for a given bias as the number of holes stored in the steady state is increased, and as the dynamic B+ is applied to the transistor, the barrier capacitance and resistance vary in dependency on the magnitude of the dynamic B+. Similar relationships exist between the magnitude of the dynamic B+ and the dynamic barrier capacitance and resistance of the transistor. These relationships determine in part the magnitude of the steady state as explained in connection with Figs. 3A, 3B and 3C.

The number of electrical charge carriers stored in the steady state is also dependent in part upon the value of the load impedance and consequently may be varied by changing the value of the load impedance. Hence, in Fig. 1 the magnitude of the steady state may be controlled by variable resistor 14 and in Fig. 2 the magnitude of the steady state may be controlled by any one of the variable resistors shown, for example, variable resistors 25 or 33.

Figure 4:
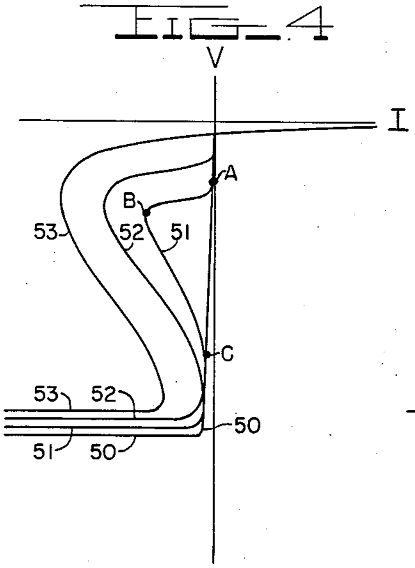
Fig. 4 represents a family of voltage current characteristic curves including negative resistance curves of the variable impedance device shown in the circuit of Figs. 1 or 2.
Figure 5:
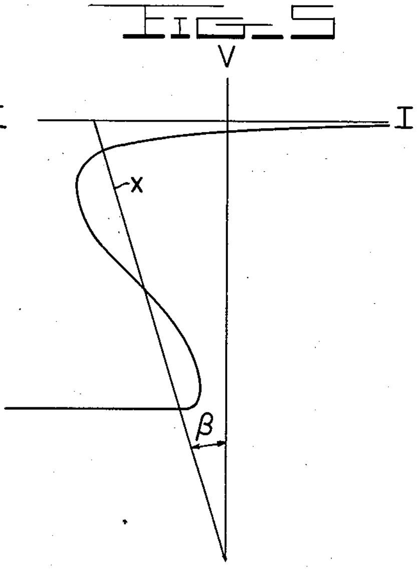
Fig. 5 represents a load line drawn on the negative resistance curve of the variable impedance device shown in the circuit of Figs. 1 or 2 when the circuit is operated as a bistable device.

Referring to Fig. 4, the voltage-current characteristic curves shown in this figure may be obtained for either variable impedance device 13 or 21 when employed in the bistable circuits shown in Figs. 1 or 2, respectively. Accordingly, curve 50 represents the voltage-current characteristic curve of either variable impedance device 13 or 21 when the magnitude of dynamic B+ applied to the variable impedance device is zero. The lower straight horizontal portion of curve 50 represents the operation of the variable impedance device when breakdown voltage is applied to the variable impedance device so it operates in what is commonly called the "Zener" region. Curve 51 represents the voltage-current characteristic when a relatively small magnitude of dynamic B+ is applied and curves 52 and 53 represent the voltage-current characteristic when the relative magnitude of dynamic B+ is increased, the magnitude of dynamic B+ applied to obtain curve 53 being greater than the magnitude applied to obtain curve 52. It is noted that as the magnitude of dynamic B+ is increased, the conductivity of variable impedance device 13 or 21 increases i.e., the current flow through the variable impedance device, per unit of voltage applied, increases. This is attributed to the storage of electrical charge carriers. It is, in effect, internal positive feedback and results in regeneration. Figures 4, 5 and 6 depict voltage-current curves having a characteristic which is generally termed in the art as an "S" type, voltage controlled, or "short circuit stable" negative resistance characteristic. For purposes of the present disclosure, the term "short circuit stable" is employed to define this type of negative resistance characteristic.

Thus, in the circuit shown in Figs. 1 or 2, as the magnitude of dynamic B+ is increased, the number of stored electrical charge carriers is increased and curve 50 assumes the position of portion AB of curve 51. As the voltage across variable impedance device 12 or 21 increases still further, regeneration is increased still further until with sufficient regeneration negative resistance appears at point B on curve 51. Thereafter increased voltage across variable impedance device 13 or 21 will form the negative resistance portion BC of curve 51. It is noted that in the voltage-current characteristic curves 51, 52 and 53 that the "Zener" region is displaced slightly upward. This is due to the presence of minority carriers and the variation of field necessary for breakdown.

Referring to Fig. 5, it is noted that the load line X is drawn on a voltage-current characteristic curve that may be representative of the bistable circuit shown in either Figs. 1 or 2. Load line X is drawn through a point on the voltage ordinate in Fig. 5 that is determined by the bias applied to either variable impedance device 13 or 21 in Figs. 1 or 2, respectively, by the source of direct current voltage shown in those figures at an angle $\beta$ whose cotangent is equal to the value of the variable resistors connected in the circuit assuming that other impedances in the circuit are negligible. It is noted that the load line X intersects the voltage current characteristic curve in regions where the slope of the curve is negative as well as positive. The points of intersection in the positive regions represent stable states of operation for the bistable circuit shown in Figs. 1 or 2. It is readily apparent, therefore, that the bistable circuits shown in Figs. 1 or 2 may be triggered from one stable state to another by the magnitude and polarity of the voltage applied by the source of input signals to increase the current through the variable impedance device. The bistable circuits may, likewise, be triggered by varying the slope of the load line X or by varying the phase, duration of the signals applied to the variable impedance devices 13 or 21, by varying the bias, or by varying the frequency, phase, or duration of dynamic B+ applied to these variable impedance devices.

Although the disclosed embodiments of the present invention are arrangements that function as bistable circuits, the teachings of the present disclosure may be used to devise a monostable or astable circuit. With proper choice of load and bias for a given circuit configuration, employing a certain variable impedance device and dynamic B+, the arrangement shown in Figs. 1 or 2 will function as a monostable or astable device.

Referring to Fig. 6, a mode of operation for the bistable circuits shown in Figs. 1 or 2 is shown in which they may be operated as a monostable device. To operate the multistable circuit of Figs. 1 or 2 as a monostable device, the value of the load and bias are selected so that the load line Y will intersect the voltage current characteristic to the left of the S-region of the voltage current characteristic curve, i.e., in Fig. 6 to the left of point K. An input signal of sufficient magnitude is applied to the variable impedance device to trigger the bistable circuit so that the load line Y will shift to position Y' shown in Fig. 6. The magnitude of the input signal must be sufficient so that the load line Y' will intersect the voltage current characteristic to the right of the S-region, i.e., in Fig. 6 to the right of point L. The input signal is temporarily stored in the various capacities of the multistable circuit such as in the barrier or base capacity and the capacity of the elements external to the variable impedance device. When the signal leaks off these capacities the load line will shift back to its original position Y. Thus, it is seen that the bistable circuits shown in Figs. 1 and 2 may be operated as and in a manner similar to conventional monostable devices.

The circuits shown in Figs. 1 and 2 may be operated as an astable device by selecting the load on the variable impedance device so that its value is less than the magnitude of the negative resistance of the variable impedance device when operated in the above mentioned circuits.

Referring to Fig. 7, the rectangular train of voltages represents the output voltage across the variable resistors shown in Figs. 1 or 2 when the circuit is operated as a bistable device. The waveform above the time abscissa represents the voltage across the output resistor when the bistable device is in the first stable state and the portion of the rectangular voltage curve below the time abscissa represents the voltages across the output resistor when the bistable device is in the second stable state. The train of pulses in the lower portion of the figure represents the triggering pulses required to shift the bistable device from one stable state to another. It is noted that the magnitude of the ouput voltage in one stable state is greater than the magnitude of the output voltage in the other stable state. This may be attributed to the fact that when the variable impedance device is switched from one stable state to the other the current through the variable impedance device and the impedance of the variable impedance device are considerably altered. When the variable impedance device is in the low impedance condition, high current flows through the device resulting in a high voltage drop and accordingly a high voltage across the output resistor. Likewise, when the variable impedance device is in the high impedance condition low current flows through the output resistor resulting in a low output voltage being developed across the resistor.

It should be understood, of course, that the foregoing disclosure relates to only a preferred embodiment of the present invention and that it is intended to cover all changes and modifications of the examples of the invention herein shown for the purposes of the disclosure, which do not constitute departures from the spirit and scope of the invention as defined in the appended claims.

What is claimed is:

1. In a signal generating device, a slab of a first material including means for storing a steady state of electrical charge carriers having a lifetime whose reciprocal is less than a selected frequency, said first material having pairs of areas of at least a second material, each area of a pair being located on opposite sides of the slab, a source of energy providing signals having a frequency greater than said selected frequency, means for connecting the output of said source of energy between each of said pairs of areas, a plurality of output circuits, means for connecting each of said plurality of output circuits between a respective pair of said pairs of areas, a source of input signals, and means for connecting said source of input signals to said slab.

2. In a signal generating device, a slab of a first material including means for storing a steady state of electrical charge carriers having a lifetime whose reciprocal is less than a selected frequency, said first material having pairs of areas of at least a second material, each area of a pair being located on opposite sides of the slab, a source of energy providing signals having a frequency greater than said selected frequency, a plurality of impedance elements, means connecting each of said plurality of impedance elements in series with the output of said source of energy between a respective pair of said pairs of areas, a source of input signals, and means for connecting said source of input signals to said slab.

3. In a semiconductor device, a base element of a selected semiconductor material capable of storing minority charge carrier of selected lifetime and characterized by a selected minority carrier diffusion length, said base element having at least one pair of areas of at least a second selected material, said areas in each pair being separate and distinct and each area paired with the closest area thereto, said areas in each pair having a maximum separation which is said diffusion length in said semiconductor material, said material of said areas being selected with respect to said semiconductor material such that a polarized PN junction is formed in the contact region between said materials in each area, each of said junctions including electrical connection means, the polarization of each of said junctions being such that injection of minority carriers occurs when current flow therethrough is in the direction of said base, at least one signal generating means having an output which is a series of pulses of alternating polarity, means for electrically connecting said signal generating means across said base element via said electrical connection means of said polarized junctions in each respective pair of areas in series arrangement, said polarized junctions in each series arrangement being connected in back to back relation, at least one of said means for electrically connecting including an output load impedance, each pulse in the output of said signal generating means having a selected magnitude and said series of pulses having a repetition rate greater than the reciprocal of the lifetime of the minority charge carriers in said base element whereby a short circuit stable negative resistance characteristic is obtained; a source of input signals, and means for connecting said source of input signals to said base element.

4. The device as defined in claim 3 wherein said base element is a part of a transistor and the collector and emitter junctions of said transistor are said PN junctions in said pair of areas.

5. The device as defined in claim 3 wherein said base element is a slab and said areas in said pairs of areas are disposed on opposite faces of said slab.

6. The device as defined in claim 3 wherein said source of input signals has an electrical signal output.

7. The device as defined in claim 3 wherein at least one of said means for electrically connecting includes bias means.

References Cited in the file of this patent

UNITED STATES PATENTS

| | | |
|---|---|---|
| 2,486,776 | Barney | Nov. 1, 1949 |
| 2,600,500 | Haynes et al. | June 17, 1952 |
| 2,627,039 | MacWilliams | Jan. 27, 1953 |
| 2,627,575 | Meacham et al. | Feb. 3, 1953 |
| 2,644,892 | Gehman | July 7, 1953 |
| 2,666,816 | Hunter | Jan. 19, 1954 |
| 2,774,890 | Semmelman | Dec. 18, 1956 |
| 2,778,956 | Dacey et al. | Jan. 22, 1957 |
| 2,795,762 | Sziklai | June 11, 1957 |
| 2,820,145 | Wolfendale | Jan. 14, 1958 |
| 2,852,677 | Shockley | Sept. 16, 1958 |
| 2,863,056 | Pankove | Dec. 2, 1958 |
| 2,889,467 | Endres et al. | June 2, 1959 |
| 2,895,109 | Weinreich | July 14, 1959 |